(12) United States Patent
Schaetzle et al.

(10) Patent No.: US 8,373,585 B2
(45) Date of Patent: Feb. 12, 2013

(54) DIAGNOSTIC CIRCUIT FOR MONITORING AN ANALOG-DIGITAL CONVERTER CIRCUIT

(75) Inventors: Ralf Schaetzle, Fischerbach (DE); Manfred Kopp, Wolfach (DE)

(73) Assignee: VEGA Grieshaber KG, Wolfach (DE)

( * ) Notice: Subject to any disclaimer, the term of this patent is extended or adjusted under 35 U.S.C. 154(b) by 472 days.

(21) Appl. No.: 12/750,125

(22) Filed: Mar. 30, 2010

(65) Prior Publication Data

US 2010/0271000 A1 Oct. 28, 2010

Related U.S. Application Data (60) Provisional application No. 61/173,347, filed on Apr. 28, 2009.

(30) Foreign Application Priority Data

Apr. 28, 2009 (EP) ..................................... 09158909

(51) Int. Cl.
*H03M 1/10* (2006.01)
(52) U.S. Cl. .......................... 341/120; 341/118; 341/155
(58) Field of Classification Search .......... 341/117–120, 341/155, 156, 163
See application file for complete search history.

(56) References Cited

U.S. PATENT DOCUMENTS

| | | | | |
|---|---|---|---|---|
| 5,419,197 A | * | 5/1995 | Ogi et al. | 73/659 |
| 5,511,004 A | * | 4/1996 | Dubost et al. | 702/183 |
| 5,880,376 A | * | 3/1999 | Sai et al. | 73/861.08 |
| 5,970,430 A | * | 10/1999 | Burns et al. | 702/122 |
| 6,014,612 A | * | 1/2000 | Larson et al. | 702/183 |
| 6,163,291 A | * | 12/2000 | Uchino et al. | 341/163 |
| 6,434,504 B1 | | 8/2002 | Eryurek et al. | |
| 7,018,800 B2 | | 3/2006 | Huisenga et al. | |
| 7,280,048 B2 | | 10/2007 | Longsdorf et al. | |
| 2007/0186678 A1 | | 8/2007 | Griessbaum et al. | |
| 2007/0252744 A1 | | 11/2007 | Takeuchi | |
| 2009/0167575 A1 | | 7/2009 | Mitani et al. | |

FOREIGN PATENT DOCUMENTS

| | | |
|---|---|---|
| DE | 44 07 369 | 9/1995 |
| DE | 10 2006 006 572 | 8/2007 |
| EP | 1 517 200 | 3/2005 |
| EP | 1 968 195 | 9/2008 |
| WO | 2006/104712 | 10/2006 |

* cited by examiner

*Primary Examiner* — Jean B Jeanglaude
(74) *Attorney, Agent, or Firm* — Fay Kaplun & Marcin, LLP (57) ABSTRACT

Described is monitoring of an analog-digital conversion of a measured value of at least one of a pressure gauge, a level gauge and a flowmeter. Different measured values can be provided for the analog-digital converter by means of a first microcontroller, wherein these measured values are subsequently transmitted from this first area into a second area by means of a unidirectional coupler. These values are acquired by a second microcontroller in the second area and compared with reference values that are stored in the second area or at another location. This diagnostic circuit may make it possible to detect drifts of resistances and of reference voltages, as well as a faulty analog-digital converter or a program execution error of the first microcontroller.

14 Claims, 3 Drawing Sheets

DIAGNOSTIC CIRCUIT FOR MONITORING AN ANALOG-DIGITAL CONVERTER CIRCUIT

REFERENCE TO RELATED APPLICATIONS

This application claims the benefit of the filing date of EP Patent Application Serial No. EP 09 158 909.3 filed 28 Apr. 2009, the disclosure of which is hereby incorporated herein by reference and U.S. Provisional Patent Application Ser. No. 61/173,347 filed 28 Apr. 2009 the disclosure of which is hereby incorporated by reference.

FIELD OF THE INVENTION

The invention pertains to the analog-digital conversion of sensor values. The invention particularly pertains to a diagnostic circuit for monitoring an analog-digital converter circuit during the input of a measured value of a level gauge, a pressure gauge or a flowmeter, to a level gauge with a diagnostic circuit, to a pressure gauge with a diagnostic circuit, to a flowmeter with a diagnostic circuit, as well as to a method for monitoring an analog-digital converter circuit.

TECHNICAL BACKGROUND

The basic structure of an input for analog sensors may consist of a resistor that is integrated into a measuring loop and at which a voltage drop can be measured. If the resistance value is theoretically known, the current can be calculated based on the measured voltage. No monitoring measures are provided, i.e., it is not determined whether the calculated current also corresponds to the actual sensor current.

Such a structure may not make it possible to counteract variations that are, for example, temperature-related.

Especially in the field of level and pressure measurements, an exact determination of sensor values or, in other words, an exact determination of levels and pressures is very important. Faulty measurements not only may have technical effects such as overstraining of raw materials in case of an excessively high pressure. They may also be associated with other economical effects and disadvantages for the user of a sensor, i.e., a level or a pressure gauge.

SUMMARY OF THE INVENTION

The present invention relates to a diagnostic circuit for monitoring an analog-digital converter circuit during the input of a measured value of a level gauge, a pressure gauge or a flowmeter, a level gauge, a pressure gauge, a flowmeter and a method for monitoring an analog-converter circuit during the input of a measured value of a level gauge, a pressure gauge or a flowmeter.

The described exemplary embodiments likewise pertain to the diagnostic circuit, the level gauge, the pressure gauge, the flowmeter and the method.

It should furthermore be noted that, in the context of the invention, the term sensor may refer to a measuring device, particularly to level gauge, pressure gauge and flowmeter. Furthermore, the term sensor value should be interpreted in such a way that an analog signal of the sensor that is converted into a digital signal by means of the invention is fed to the diagnostic circuit. This may concern, for example, an electric sensor current that is converted into an analog signal by means of the invention.

The term current sensing resistor unit may refer to electric resistors, inductors and capacitors.

It should furthermore be noted that the term electric resistor may, in the context of the invention, always be interpreted as being included in the term current sensing resistor unit.

According to one exemplary embodiment of the invention, a diagnostic circuit for monitoring an analog-digital converter circuit during the input of a measured value of a level gauge, a pressure gauge or a flowmeter is disclosed. In this case, the diagnostic circuit features a multiplexer for selecting different signals and a first microcontroller for controlling at least the multiplexer. Furthermore, a supply voltage is provided for the microcontroller and the diagnostic circuit is designed for detecting a change in the supply voltage on the basis of a comparison of the supply voltage with a stored supply voltage reference value of the supply voltage by utilizing the multiplexer and the first microcontroller.

This may provide for an improved analog-digital conversion during the input of a measured value of a level gauge, a pressure gauge or a flowmeter.

The measured value for the diagnostic circuit may be provided, for example, by means of an electric current. This electric current can be calculated after a voltage measurement on a first current sensing resistor unit that may be realized in the form of an electric resistor if the value of the current sensing resistor unit is known. This may, if desired, also be realized and provided by the diagnostic circuit.

The diagnostic circuit may be part of a sensor, i.e., a pressure gauge, a level gauge or a flowmeter. However, this diagnostic circuit may also be arranged distant from the sensor. In this case, the measured value determined by the sensor is fed to the diagnostic circuit, for example, via an electric line by means of an electric current. However, different types of feeding the measured values may also be considered.

In the special instance, in which the sensor consists of a level gauge, a pressure gauge or a flowmeter, the measured value consequently is a level, a pressure or a flow. This measured value may have been determined by the sensor, for example, with the aid of electromagnetic waves.

The current sensing resistor unit may furthermore comprise one or more electric resistors that are connected to the diagnostic circuit in such a way that the voltage dropping at the respective electric resistors during the operation of the diagnostic circuit can be respectively read out. It is also possible to measure the total voltage drop occurring at several series-connected electric resistors.

Furthermore, the analog-digital converter can convert analog input signals into digital data or a data stream in accordance with different methods. This digital data or data stream can then be additionally processed or stored. The subsequent additional processing by means of the counterpart, namely a digital-analog converter, is also possible. With respect to the basic function of the analog-digital converter, it should be noted that the analog-digital converter quantizes a continuous voltage signal with respect to the time, as well as the amplitude. In this case, several resolutions in bit and several conversion speeds may be predefined for the analog-digital converter.

Furthermore, the multiplexer may be realized in the form of a selective combinatorial circuit that may make it possible to select one input signal from a number of input signals on the input channels of the multiplexer. These input signals may, e.g., consist of the supply voltage, voltages that drop at individual or series-connected resistors or voltages that are predefined by means of a potentiometer or in a different way.

This means that parallel data streams can be converted into serial data streams by means of a cyclic sweep of the input channels of the multiplexer. For example, switching of the multiplexer makes it possible to measure different voltage states at different multiplexer inputs by means of the multiplexer. Consequently, the multiplexer features several inputs or input channels and at least one output, wherein the input signal, the channel of which is currently selected by the multiplexer, is respectively applied to the output depending on the switching state of the multiplexer.

The output signal of the multiplexer can then be forwarded to the analog-digital converter. In this case, the different signals to be selected by the multiplexer are analog signals such as, for example, a sensor current, a voltage that drops at a current sensing resistor unit, a voltage that drops at several current sensing resistor units, a voltage that is predefined by a potentiometer, a supply voltage of the microcontroller or any other analog signal generated by the sensor during the measurement of the measured value.

Furthermore, the first microcontroller is realized, for example, in the form of a semiconductor chip. In this case, the microcontroller practically is a 1-chip computer system. Consequently, it is also possible to use the term "System on a Chip" for the microcontroller used in the context of the invention. The microcontroller may furthermore feature programmable digital and/or analog function blocks.

Furthermore, so-called peripheral functions such as, for example, Controller Area Network functions, Local Interconnect Network functions, Universal Serial Bus functions, Inter-Integrated Circuit functions, Serial Peripheral Interface functions, serial or Ethernet interfaces, PWM-outputs, LCD-controllers and drivers, analog-digital converters and multiplexers may also be arranged on the microcontroller.

The first microcontroller may furthermore be designed for storing any reference values described in the context of the invention. It is also possible to store flow charts or protocols of different processes on the microcontroller. Two special cyclic processes or flowcharts are discussed in greater detail below. These two cyclic processes are an important aspect of the invention. The microcontroller may furthermore be designed for controlling and for adjusting the multiplexer and the analog-digital converter.

Furthermore, the microcontroller may be realized on a circuit board and feature the characteristics of the diagnostic circuit, the analog-digital converter and the multiplexer.

Consequently, an integral design of these components is disclosed. However, it is also possible to realize a discrete arrangement of the multiplexer and a discrete arrangement of the analog-digital converter with a separate first microcontroller within the diagnostic circuit.

Furthermore, the stored supply voltage reference value and/or other reference values may be stored in the first microcontroller. However, the storage in a second microcontroller in a second area, in a separate external memory or in a memory on the circuit board, on which the first microcontroller, the analog-digital converter and the multiplexer are arranged, is also possible. The supply voltage reference value can also be stored in a third microcontroller. In other words, reference values do not have to be stored in the microcontroller. The values can also be stored in an external memory, to which the corresponding microcontroller has access. In this case, this additional microcontroller may be spaced apart from the first microcontroller and lie in another area of the diagnostic circuit that complies with other safety criteria and/or standards than the area of the first microcontroller. Furthermore, both microcontrollers can fulfill different safety requirements and be connected to one another, for example, by means of a unidirectional optical coupler (optocoupler). In this case, the optocoupler may be realized in such a way that it bridges a safety clearance between the first and the second microcontroller. The process of detecting a change in the supply voltage by means of the diagnostic circuit in accordance with this exemplary embodiment of the invention is described in greater detail below:

The supply voltage reference value may be stored in the desired location once, for example, during a calibration of the diagnostic circuit. The supply voltage provided for the microcontroller can be tapped and measured by means of the multiplexer. It is furthermore forwarded to the analog-digital converter by the multiplexer. The analog-digital converter consequently converts the analog signal of the supply voltage into a digital signal. This signal can be referred to as digital supply voltage signal. If this digital supply voltage signal does not correspond to the previously stored supply voltage reference value, the diagnostic circuit can determine that either the analog-digital converter has a malfunction or a reference diode of the analog-digital converter is defective.

The reference diode may be integrated into the AD-converter or also be arranged externally. The reference diode serves as reference value for the AD-converter, i.e., if the reference value changes, the AD-converter values are also falsified accordingly. A reference diode may consist, e.g., of a high-precision Zener diode, the voltage value of which only drifts or changes as a function of the temperature within the specified narrow range.

This is a reason why this diagnostic circuit may make it possible to discover defects in the analog-digital converter circuit. Consequently, it is possible to detect, for example, drifting of the reference voltage of the analog-digital converter. In this case, all calibration values of the analog-digital converter can be stored in the desired location in the above-described fashion.

According to another exemplary embodiment of the invention, the diagnostic circuit features a first and a second current sensing resistor unit. In this case, the diagnostic circuit is designed for detecting a change of one of the two current sensing resistor units on the basis of a comparison with a stored resistance reference value of the current sensing resistor units.

It may also be possible to store several resistance reference values. Analogous to the supply voltage reference value, the resistance reference values may be stored in the first microcontroller, in a separate external memory or in an additional second microcontroller. For example, it is possible to store the ratio between the sum of the first and second current sensing resistor units and the second current sensing resistor unit or the ratio between the first current sensing resistor unit and the second current sensing resistor unit.

The first current sensing resistor unit and the second current sensing resistor unit may be realized in the form of electric resistors. In this case, the resistance reference value may correspond, for example, to the ratio between the sum of the first and second electric resistors and the second electric resistor or the first electric resistor. It would likewise be possible that both electric resistors are individually stored in the form of two resistance reference values.

The detection of a change of one of the two current sensing resistor units is described in detail below: for example, the multiplexer may be provided with the voltage drop at both current sensing resistor units and the voltage drop at one of the two current sensing resistor units. A comparison of the ratio between these two voltage drops with the stored value, i.e., the resistance reference value, makes it possible to detect that one of the two current sensing resistor units is drifting. In other words, the voltage ratio consisting of a first voltage that drops at both electric resistors and a second voltage that drops at one of the two electric resistors makes it possible to determine the instantaneous ratio between both resistors. This ratio is compared with the stored resistance reference value. A comparison of these two resistance ratios therefore makes it possible to discover a change of at least one of the two resistors. In this case, the diagnostic circuit is able to detect a change that is caused, for example, by thermal variations or by aging processes.

According to another exemplary embodiment of the invention, the diagnostic circuit is designed for detecting a change of one of the two current sensing resistor units on the basis of a comparison of the resistance ratio of the two current sensing resistor units.

According to another exemplary embodiment, the diagnostic circuit is designed for carrying out a corresponding adaptation of the stored resistance reference value of the current sensing resistor units if a change of one of the two current sensing resistor units is detected.

Consequently, the diagnostic circuit is able to enter a new reference value at the memory location, at which the reference value was stored so far. This can be carried out by the diagnostic circuit for each reference value used within the invention.

According to another exemplary embodiment of the invention, the diagnostic circuit furthermore features an analog-digital converter for converting an analog signal into a digital signal and a potentiometer for generating an analog potentiometer signal. In this case, the analog-digital converter converts the potentiometer signal into a digital potentiometer signal. Furthermore, the diagnostic circuit is designed for detecting a malfunction of the analog-digital converter on the basis of a comparison of the analog potentiometer signal with the digital potentiometer signal. The potentiometer may consist of a digital potentiometer. In other words, the entire working range of the analog-digital converter can be monitored with respect to a voltage range by means of the digital potentiometer. The digital potentiometer is able to predefine all voltage values for the analog-digital converter that it should be able to properly convert into digital signals in accordance with its operating function. In this case, the analog potentiometer signal provided by the potentiometer is selected by the multiplexer and fed to the analog-digital converter. For example, a cyclic process, in which it is chronologically defined which analog potentiometer signal is applied to the analog-digital converter by the potentiometer, may be stored in a second microcontroller. The digital output signal (digital potentiometer signal) of the converter that was converted on the basis of this input signal can then be measured and transferred, for example, to the second microcontroller. This second microcontroller compares this value with the stored value that should now actually be output by the converter in accordance with the stored cyclic process (nominal value of the digital potentiometer signal that serves as reference value).

In other words, the second microcontroller expects the digital potentiometer signals that are output by the potentiometer and converted by the analog-digital converter due to the cyclic process of monitoring the analog-digital converter stored in the second microcontroller. If the values do not correspond, this may indicate a faulty analog-digital converter or a faulty reference diode. This may be detected by the diagnostic circuit.

According to another exemplary embodiment of the invention, the diagnostic circuit features a second microcontroller. Furthermore, the second microcontroller is designed for detecting a program execution error of the first microcontroller.

The second microcontroller may make it possible, for example, to control a program execution stored in the first microcontroller. For example, the first microcontroller may contain a first program that prompts the first microcontroller to cyclically transmit the following values of the analog-digital converter to the second microcontroller: 1. supply voltage of the first microcontroller, 2. voltage drop at the first and the second current sensing resistor unit, 3. voltage drop at one of the two current sensing resistor units and the digital potentiometer signal that is based on the analog signal of the potentiometer and converted. These four items correspond to a first cyclic process. If the chronology of these values that [text missing] by the first microcontroller by switching the multiplexer, as well as the subsequent transfer of the value from the multiplexer to the analog-digital converter and the subsequent transmission to the second microcontroller, does not correspond to the chronology expected by the second microcontroller, the diagnostic circuit is able to detect a program execution error in the first microcontroller. However, this also enables the diagnostic circuit to detect a transmission error between the first microcontroller and the second microcontroller.

In other words, the first microcontroller controls and adjusts the multiplexer, as well as the transmission of the signals to the analog-digital converter and another transmission from the analog-digital converter to the second microcontroller, in accordance with a first cyclic process, namely by means of a program that is stored in the first microcontroller. Corresponding reference values are stored in the second microcontroller, which is the reason why the second microcontroller expects a certain chronology of the reference values. If the transmitted values deviate from the stored chronology, an above-described detection by the diagnostic circuit can take place.

According to another exemplary embodiment of the invention, the diagnostic circuit features a unidirectional coupler, wherein the first current sensing resistor unit, the analog-digital converter, the multiplexer and the first microcontroller are arranged in a first area of the circuit. Furthermore, the second microcontroller is arranged in a second area of the circuit, wherein the second area fulfills stricter safety requirements than the first area. The coupler furthermore allows a unidirectional signal transmission from the first area into the second area, and the reference value or the reference values is/are furthermore stored in the second area.

Consequently, the diagnostic circuit features a first and a second area. In this case, the first area may be referred to, for example, as sensor input and the second area may be referred to, for example, as digital part. It would furthermore be possible to provide a third part, in which the power supply is situated. For example, the first area sensor input may fulfill the safety requirements of an "intrinsically safe circuit." The device then consists of a so-called "associated electrical apparatus," namely an electrical apparatus with circuits that are intrinsically safe, as well as circuits that are not intrinsically safe, wherein the device is realized in such a way that the circuits that are not intrinsically safe cannot impair the intrinsically safe circuits. An intrinsically safe circuit is a circuit, in which no spark or no thermal effect can lead to the ignition of an explosive atmosphere (the explosion protection is described in ATEX Product Guideline 94/9/EG).

For example, these two areas may be arranged on a circuit board such that they are spaced apart by a minimum distance. This minimum distance can be bridged, for example, with the unidirectional coupler. The unidirectional coupler may be realized, for example, in the form of a unidirectional optocoupler in this case. Due to the unidirectional coupling, i.e., a coupling that only allows the transmission of electromagnetic signals in one direction, the two areas are electrically decoupled by the unidirectional coupler. Since the second area or the digital part with the second microcontroller needs to fulfill stricter safety requirements, the second microcontroller is better protected from interfering external influences such as, for example, heat, explosions, mechanical effects, magnetic effects and electromagnetic effects. This safety advantage of the second area is used for storing the valuable reference and test values used in the context of the invention at this location. The function of the first microcontroller and a function of the analog-digital converter in the first area, as well as the values of the current sensing resistor units, can be reliably checked by means of these reference and test values. Even after the occurrence of interfering influences such as, for example, a fire, it can be assumed that the checking and monitoring functions of the analog-digital converter circuit still operate correctly because the reference and test values could not have been affected by these influences.

According to another exemplary embodiment of the invention, the diagnostic circuit features a bidirectional coupler, wherein the first current sensing resistor unit, the analog-digital converter and the multiplexer are arranged in a first area of the circuit. In this case, the first microcontroller is arranged in a second area of the circuit, wherein the second area fulfills stricter safety requirements than the first area. Furthermore, the coupler is designed for allowing a bidirectional signal transmission from the first area into the second area. The first microcontroller is furthermore designed for adjusting at least the multiplexer or the analog-digital converter.

In other words, the first microcontroller is positioned in the area with stricter safety requirements. Furthermore, the reference and test values used for monitoring the analog-digital converter circuit in the context of the invention are stored in the first microcontroller. The bidirectional coupler now makes it possible to access the multiplexer and the analog-digital converter externally, i.e., from the secured second area. Consequently, this diagnostic circuit is able to detect drifting of the current sensing resistor units and drifting of the reference voltage of the analog-digital converter in the above-described fashion. A potentiometer situated in the first area can also be controlled and adjusted, for example, by the first microcontroller. Consequently, a faulty analog-digital converter can also be detected with the above-described detection method by means of a potentiometer. For example, the multiplexer may furthermore be cyclically activated by the first microcontroller in such a way that the following values are transmitted in the following sequence. Supply voltage of the first microcontroller, voltage drop at both current sensing resistor units, voltage drop at one of the two current sensing resistor units and reference value or test value predefined by means of the potentiometer. The values that are subsequently transmitted to the first microcontroller in this sequence via the bidirectional coupler can then be checked with the reference and test values stored within the first microcontroller.

According to another exemplary embodiment of the invention, the first area fulfills the requirements of an intrinsically safe circuit and the second area is realized in the form of a circuit that is not intrinsically safe.

The first area is correspondingly separated from the second area in this case. However, the entire device complies with a safety standard.

In this case, the safety standard may consist, for example, of the SIL3 or the SIL4 standard. Due to the separation into these two areas, reliable monitoring of an analog-digital converter by means of the diagnostic circuit can be realized.

According to another exemplary embodiment of the invention, the diagnostic circuit features an electrical isolation between the first and the second area.

Due to this electrical decoupling, it can be ensured that no electric signals and interfering influences can be exchanged between the two areas.

According to another exemplary embodiment of the invention, at least one element that is selected from the group consisting of first microcontroller, multiplexer, analog-digital converter, potentiometer, first current sensing resistor unit and second current sensing resistor unit is realized in the form of a discrete, separate component.

In contrast to a variation, in which a microcontroller, a multiplexer and an analog-digital converter may be arranged on a circuit board in the form of an integrated system, it is also possible to realize a discrete design that fulfills the functions of the above-described diagnostic circuit. In this case, it may be advantageous to realize a separate and discrete variation, for example, for cost reasons.

According to another exemplary embodiment of the invention, the analog signal is an analog electric current signal and the electric current signal is generated by a level gauge, a pressure gauge or a flowmeter. Furthermore, the electric current signal corresponds to such a measured level, pressure or flow value.

In the input of a measured value of a level gauge, a pressure gauge or a flowmeter for the conversion into a digital signal, it is therefore possible to disclose a monitoring of the conversion. Consequently, this diagnostic circuit makes it possible to check the analog-digital conversion of the analog current signal of a level gauge, a pressure gauge or a flowmeter with respect to the following malfunctions: drifting of the first current sensing resistor unit, drifting of the second current sensing resistor unit, drifting of the reference voltage of the analog-digital converter, faulty analog-digital converter and program execution error in the first microcontroller. In this case, the malfunction or the drifting is respectively detected as described in the corresponding preceding paragraphs of the invention.

According to another exemplary embodiment of the invention, a level gauge, a pressure gauge and a flowmeter with a diagnostic circuit according to one of the preceding exemplary embodiments is respectively disclosed.

According to another exemplary embodiment of the invention, a method for monitoring an analog-digital converter circuit during the input of a measured value of a level gauge, a pressure gauge or a flowmeter is disclosed. In this case, the method comprises the following steps: providing a multiplexer for selecting different signals, providing a first microcontroller for controlling at least the multiplexer, supplying the microcontroller with a supply voltage, measuring the supply voltage, comparing the measured supply voltage with a stored supply voltage reference value of the supply voltage and detecting a change in the supply voltage on the basis of the comparison.

According to another exemplary embodiment of the invention, a program element is disclosed that, when executed on a processor, instructs the processor to carry out the above-described steps of the method.

According to another exemplary embodiment of the invention, a machine-readable medium is disclosed, on which a program element is stored that, when executed on a processor, instructs the processor to carry out the above-described steps of the method.

In this case, the computer program element may, for example, the part of software that is stored on a processor of an evaluation device. The computer program element can also be used in a control unit or computer unit that controls or adjusts the sensor. This exemplary embodiment of the invention furthermore comprises a computer program element that utilizes the invention from the beginning, as well as a program element that prompts an existing program to utilize the invention due to an update (update).

As a supplement, it should be noted that "comprising" and "featuring" do not exclude other elements or steps, and that "an" or "a" does not exclude a plurality. It should furthermore be noted that characteristics or steps that were described with reference to one of the above exemplary embodiments can also be used in combination with other characteristics or steps of other above-described exemplary embodiments. Reference symbols in the claims should not be interpreted in a restrictive sense. Exemplary embodiments of the invention are described below with reference to the figures.

It may be considered to be a core aspect of the invention that the diagnostic circuit provides a first microcontroller in a first area and a second microcontroller in a second area with stricter safety requirements. In this case, all reference values and cyclic processes and program sequences that could be required for monitoring the analog-digital converter circuit during the input of a measured value may be stored in the second microcontroller. These may consist, e.g., of a supply voltage reference value, a resistance reference value, a program sequence that is stored for execution in the first microcontroller and a program sequence that is carried out by a potentiometer, as well as reference values for voltages that are predefined by a potentiometer. Another part of this core aspect may be a unidirectional coupler, by means of which the two areas are connected. In other words, this makes it possible for the second microcontroller to detect a change of electric resistors used for determining the measured value. However, an incorrect supply voltage, a faulty analog-digital converter and program sequence errors can also be detected in this fashion. In order to detect malfunctions, a multiplexer that switches the corresponding channels is arranged in the first area. An analog-digital converter is also arranged in the first area. Due to the storage of reference values and program sequences in the secure area, the monitoring that is based on these reference values and program sequences can be considered to be monitoring that fulfills stricter safety requirements.

BRIEF DESCRIPTION OF THE FIGURES

In the following description of the figures, the same reference symbols are used for identical or similar elements.

The figures show schematic representations that are not true-to-scale.

DETAILED DESCRIPTION

Figure 1:
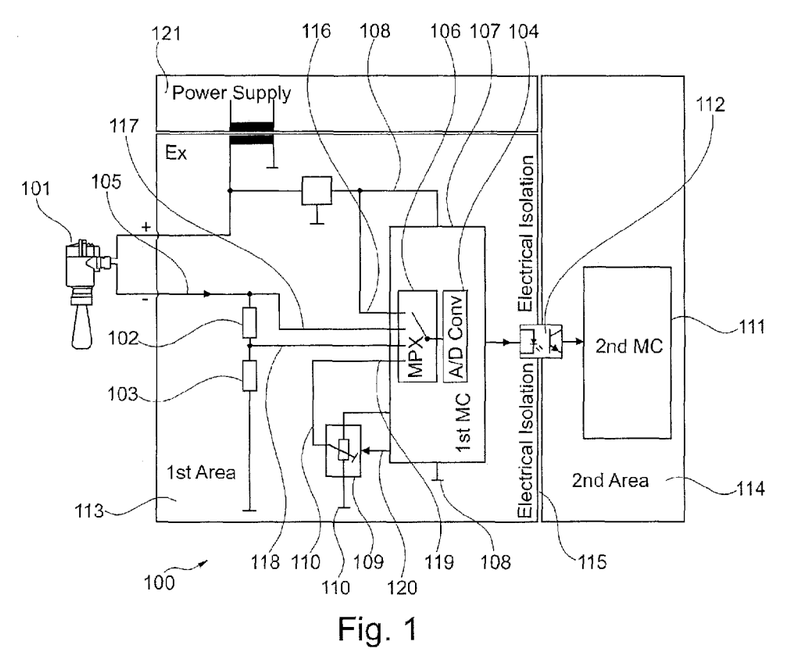
FIG. 1 shows a schematic two-dimensional representation of a diagnostic circuit for monitoring an analog-digital circuit during the input of a measured value of a level gauge, a pressure gauge or a flowmeter according to an exemplary embodiment of the invention.

FIG. 1 shows a diagnostic circuit for monitoring an analog-digital converter circuit during the input of a measured value 105 of a level gauge, a pressure gauge or a flowmeter 101. In this case, the diagnostic circuit features a multiplexer 106 for selecting different signals, a first microcontroller 107 for controlling at least the multiplexer 106 and an analog-digital converter 104 for converting an analog signal into a digital signal. The diagnostic circuit furthermore features a first current sensing resistor unit 102, wherein the microcontroller is provided with a supply voltage 108. In this case, the supply voltage is illustrated by means of the two reference symbols 108. These two reference symbols respectively represent a potential level of a voltage, wherein the supply voltage results thereof in the form of the difference between the two displayed voltage levels. Furthermore, a first current sensing resistor unit 102 and a second current sensing resistor unit 103 are shown and may be respectively realized in the form of an electric resistor. Furthermore, the diagnostic circuit 100 is designed for detecting a change in a supply voltage 108 on the basis of a comparison of the supply voltage with a stored supply voltage reference value of the supply voltage.

Furthermore, a potentiometer 109 for generating an analog potentiometer signal 110 is shown. The analog potentiometer signal is once again illustrated in the form of a voltage that, in turn, is illustrated in the form of two potential levels identified by the two reference symbols 110 in accordance with the voltage illustration principle explained above with respect to the reference symbol 108. In this case, the supply voltage 108 for the first microcontroller 107 can be used for controlling and adjusting the multiplexer 106 and the analog-digital converter 104. This figure furthermore shows that the multiplexer 106 according to this exemplary embodiment is equipped with four input channels 116 to 119, to which a different analog signal can be respectively applied. The circuit of the multiplexer can tap the supply voltage at 116, the voltage that drops at the two current sensing resistor units 102 and 103 at 117, the voltage that drops at the current sensing resistor unit 103 at 118 and the voltage generated by the potentiometer 109 on the channel 119.

This figure furthermore shows that the multiplexer 106 switches these different channels to an input channel of the analog-digital converter 104. The values of a measured value 105 digitized by the converter 104 can be transferred into the second area 114, in which a second microcontroller 111 may be situated, by means of a unidirectional coupler 112. In this case, a first area 113, in which the analog-digital converter, the multiplexer, the first microcontroller, the current sensing resistor units and the potentiometer are arranged, is designed for complying with the guidelines of the EX standard. The second area 114 may furthermore be separated from the first area by means of an electrical isolation. However, the electrical isolation 115 may also be realized in another electrically decoupling fashion. For example, the supply voltage reference value, the resistance reference value, a first cyclic process and a second cyclic process, both of which are described in detail above and below, may be stored in the second microcontroller 111 in this case.

The figure also clearly shows that the microcontroller 107 consists of the multiplexer 106 and the analog-digital converter 104. However, this integral design of the microcontroller and the respective components can also be realized in the form of a discrete and separate design. In other words, the analog-digital converter may be designed discreetly, the multiplexer may be designed discreetly and the microcontroller may be realized separately. Furthermore, the arrow 120 describes the activation of the microcontroller by the potentiometer that may be realized, for example, in the form of a digital potentiometer.

The following conditions may be fulfilled in order to monitor the input of a measured value of the device 101: the mathematical ratio between the two resistance values of the current sensing resistor units 102 and 103 is stored, for example, in the first and in the second microcontroller 111. It is furthermore possible to predefine a voltage that corresponds to the input range of the analog-digital converter with the potentiometer. Consequently, it is possible to subject the entire working range of the analog-digital converter to a test measurement. Furthermore, the calibration values for the analog-digital converter may be known and also stored in any memory location, preferably also in the second microcontroller 111.

This diagnostic circuit and a corresponding method may make it possible to monitor the analog-digital converter circuit and to detect corresponding malfunctions. The connection between the sensor input circuit that corresponds to the first area 113 and the evaluation circuit that corresponds to the second area 114 needs to be realized in the form of a unidirectional connection only, wherein this is particularly advantageous in an intrinsically safe design of the sensor input. The terms "intrinsically safe" and "intrinsic safety" refer to the sensor supply voltage provided by the evaluation device. This means that the sensor supply voltage is realized such that no spark can be created that leads to an explosion. In this case, the first microcontroller can be regarded as a so-called gray channel. This means that errors in a program execution of the programmable first microcontroller can be detected by the second microcontroller 111. This provides the advantage that the corresponding safety standards only need to be observed for the programming of the second microcontroller 111. This may represent a significant safety gain for the input of the measured value by the diagnostic circuit.

This circuit and a corresponding method therefore may make it possible to detect the following malfunctions in the analog-digital converter circuit. Drifting of the current sensing resistor units 102 and 103, for example, due to temperature drifts or aging processes. Drifting of the reference voltage 108 of the analog-digital converter can furthermore be detected. It is also possible to detect a malfunction of the analog-digital converter itself by means of the second microcontroller 111. This is realized with the aid of the potentiometer 109 as described in greater detail below. A program execution error in the first microcontroller 107 may also be detected by the second microcontroller 111.

The detection of the malfunctions or drifts of the different components of the diagnostic circuits are discussed in greater detail below. For example, the first microcontroller 107 may be programmed in such a way that the following analog-digital converter values are transmitted from the first microcontroller to the second microcontroller 111 via the unidirectional coupling unit in a cyclic fashion: 1. the supply voltage of the first microcontroller, the voltage drop at the current sensing resistor units 102 and 103 and the individual voltage drop at the current sensing resistor unit 103, as well as the digital potentiometer signal. The second microcontroller receives these values and compares them with its expected values that more specifically consist of the following reference values: 1. the supply voltage reference value of the supply voltage, 2. the resistance reference value of the current sensing resistor units, the reference value predefined by means of the potentiometer.

With respect to the supply voltage of the first microcontroller, a reference value is input and stored once, for example, in the second microcontroller 111 during the calibration at the facility. Once the supply voltage 108 of the first microcontroller 107 that is measured by the diagnostic circuits 100 no longer corresponds to the stored supply voltage reference value, the diagnostic circuit is able to detect that either the analog-digital converter or the reference diode of the analog-digital converter is defective.

Furthermore, the sensor current can be determined from the voltage drop at the current sensing resistor units 102 and 103. In this case, the sensor current corresponds to the measured value 105 generated by the sensor 101. In the example shown, this sensor consists of a level gauge 101. Since the second microcontroller knows the resistance reference value such as, for example, the ratio between both electric resistors 102 and 103, drifting of one of the two resistance values can be detected by comparing the ratio between the analog-digital converter value for the voltage drop at the current sensing resistor units 102 and 103 and the voltage drop at the current sensing resistor unit 103 with the stored value for the ratio between the sum of the electric resistors 102 and 103 and the value of the electric resistor 103. In the preceding section, the term current sensing resistor unit is equivalent to an electric resistance.

It is furthermore possible to store a second cyclic process in the second microcontroller 101 that respectively prompts the first microcontroller to apply a reference value to the input of the analog-digital converter by means of the potentiometer, wherein said reference value is then measured and transmitted to the second microcontroller. The second microcontroller compares this value with the value that it expects. If the values do not correspond, this indicates a faulty analog-digital converter or a faulty reference diode.

The program execution of the first microcontroller may also be controlled by the second microcontroller. If the chronology of the values of the first microcontroller does not correspond to the chronology expected by the second microcontroller, this indicates a program execution error in the first microcontroller. However, it may also be possible that a transmission error has occurred between the first microcontroller and the second microcontroller, but this is also detected by the diagnostic circuit.

It is furthermore possible that additional memory components, a display, a keypad and different interfaces are arranged in the second area 114 of FIG. 1 that complies, for example, with SIL Standard 3 or 4. Different requirements with respect to the hardware apply to the intrinsically safe circuit. In SIL, the entire device including electronics, mechanics and software is taken into consideration. One only distinguishes between safety-critical and safety-uncritical areas and corresponding classifications (e.g., SIL 1 or 2).

Figure 2:
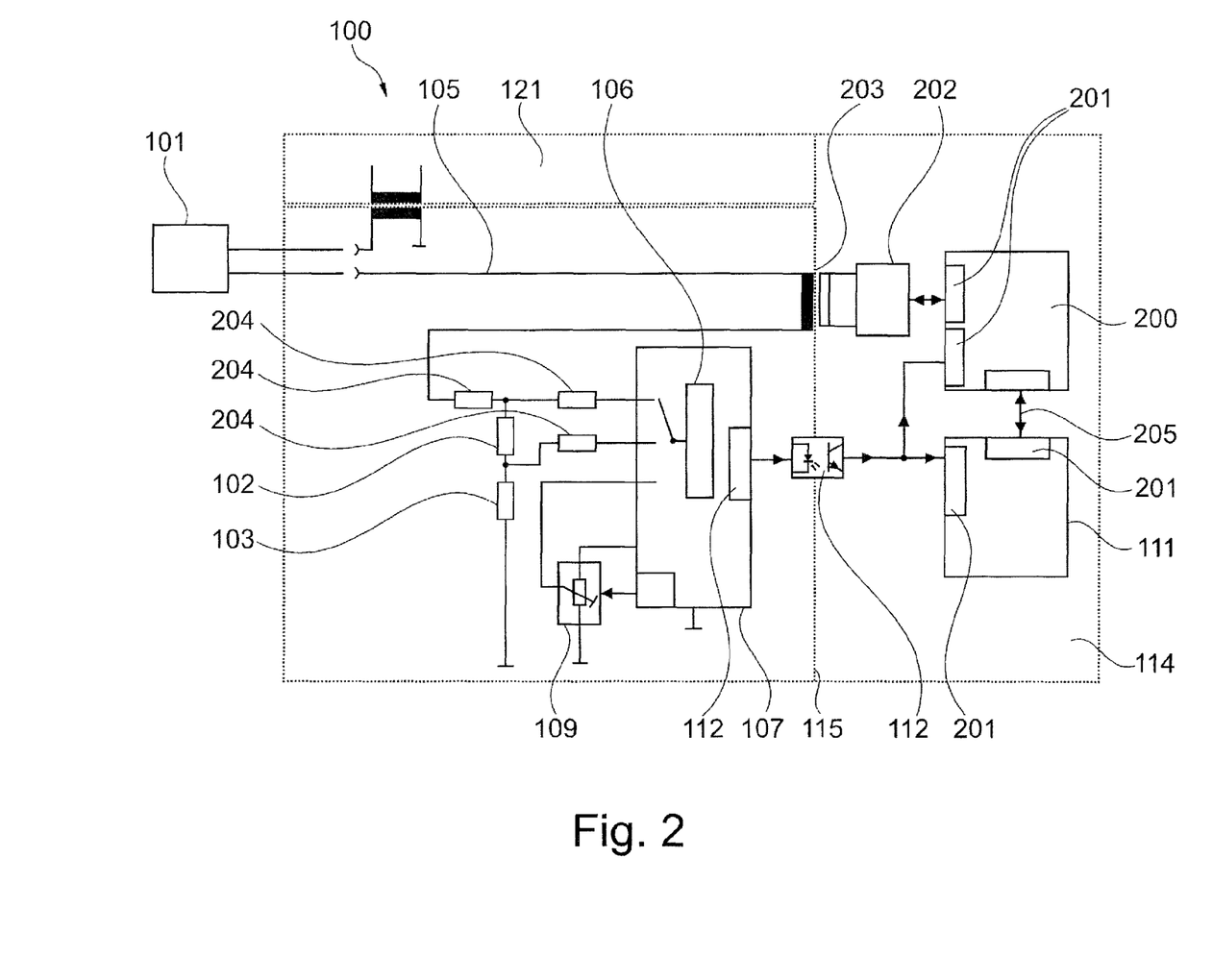
FIG. 2 shows a schematic two-dimensional representation of a diagnostic circuit for monitoring an analog-digital converter circuit during the input of a measured value of a level gauge, a pressure gauge or a flowmeter according to an exemplary embodiment of the invention.

FIG. 2 shows an exemplary embodiment of the invention, in which the diagnostic circuit is equipped with additional electrical resistors 204. This figure also shows a third microcontroller 200 that is connected to the second microcontroller 111 by means of a connection 205. The second and the third microcontroller are also respectively equipped with three and two UART inputs. This figure furthermore shows that a HART signal, by means of which digital values can be transmitted from the sensor 101 into the second area 114 via the interface 203, [text missing] by means of a HART interface 202 and a transmission point 203. In addition, the current 105 is transmitted by means of the unidirectional coupler 112 that may be realized, for example, in the form of an electrically insulating optocoupler. This figure furthermore shows an electrical isolation 115 that separates the two areas 113 and 114. A power supply 121 is also shown. In this case, all reference values, program sequences and cyclic processes mentioned in the context of the invention may also be stored in the third microcontroller. However, a division of these values among the second and third microcontroller is also possible. The HART interface serves for transmitting digital data such as, e.g., parameterization data or even digital measured values to the sensor. A UART serves for transmitting and receiving serial data (e.g., RS232 interface). In this case, the diagnostic circuit according to FIG. 2 also makes it possible to detect drifting of the first and second current sensing resistor units 102 and 103 that may be realized in the form of electric resistors. However, drifting of the reference voltage 108 of the analog-digital converter is also possible with the circuit in the above-described fashion. Furthermore, a faulty analog-digital converter can be detected by means of the above-described application with the aid of the potentiometer. A program execution error of the first microcontroller can furthermore be detected by the diagnostic circuit. With respect to a detailed description of the detection of the individual malfunctions or drifts, we refer to the detailed explanations in the general portion of the description, as well as the portion of the description referring to FIG. 1.

Figure 3:
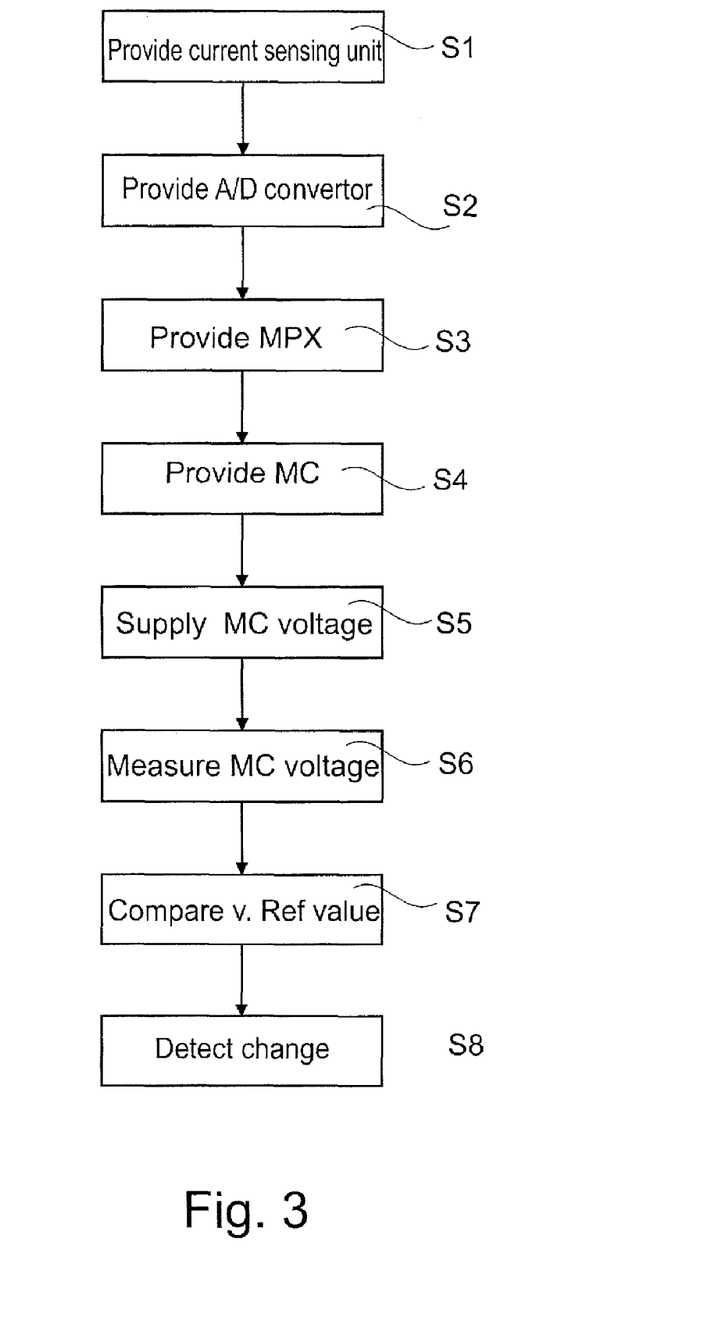
FIG. 3 shows a flow chart of process steps according to an exemplary embodiment of the invention.

FIG. 3 shows a flow chart of a method according to one exemplary embodiment of the invention. In this case, the following steps are illustrated: providing a multiplexer S3 for selecting different signals; providing a first microcontroller S4 for controlling at least the multiplexer; providing an analog-digital converter S2 for converting at least one analog signal into a digital signal; providing a first current sensing resistor unit S1; supplying the microcontroller with a supply voltage S5; measuring the supply voltage S6; comparing the measured supply voltage with a stored supply voltage reference value of the supply voltage S7, and detecting a change in the supply voltage on the basis of the comparison S8.

It should furthermore be noted that each method of the invention can be carried out in the aforementioned sequence, as well as in other sequences of the process steps.

The invention claimed is:

1. A diagnostic circuit for monitoring an analog-digital converter circuit during an input of a measured value of at least one of a level gauge, a pressure gauge and a flowmeter, comprising:
 a multiplexer selecting different signals;
 a first microcontroller controlling at least the multiplexer;
 wherein a supply voltage is provided for the microcontroller; and
 wherein the diagnostic circuit is configured to detect a change in the supply voltage on the basis of a comparison of the supply voltage with a stored supply voltage reference value of the supply voltage by utilizing the multiplexer and the first microcontroller.

2. The diagnostic circuit of claim 1, furthermore comprising:
 a first current sensing resistor unit; and
 a second current sensing resistor unit;
 wherein the diagnostic circuit is configured to detect a change of one of the first and second current sensor resistor units on the basis of a comparison between the resistance ratios of the first and second current sensing resistor units.

3. The diagnostic circuit of claim 2, wherein the diagnostic circuit is configured to carry out an adaptation of the stored resistance reference value of the current sensing resistor units if a change is detected, and wherein the adaption corresponds to the detected change.

4. The diagnostic circuit of claim 1, furthermore comprising:
 an analog-digital converter converting an analog signal into a digital signal;
 a potentiometer generating an analog potentiometer signal;
 wherein the analog-digital converter converts the analog potentiometer signal into a digital potentiometer signal; and
 wherein the diagnostic circuit is configured to detect a malfunction of the analog-digital converter on the basis of a comparison of the analog potentiometer signal with the digital potentiometer signal.

5. The diagnostic circuit of claim 1, furthermore comprising:
 a second microcontroller configured to detect a program execution error of the first microcontroller.

6. The diagnostic circuit of claim 5, furthermore comprising:
 a unidirectional coupler;
 wherein the first current sensing resistor unit, the analog-digital converter, the multiplexer and the first microcontroller are arranged in a first area of the circuit;
 wherein the second microcontroller is arranged in a second area of the circuit;
 wherein the second area fulfills stricter safety requirements than the first area;
 wherein the coupler allows an unidirectional signal transmission from the first area into the second area; and
 wherein the reference value or the reference values is/are stored in the second area.

7. The diagnostic circuit of claim 1, furthermore comprising:
 a bidirectional coupler;
 wherein the first current sensing resistor unit, the analog-digital converter and the multiplexer are arranged in a first area of the circuit;
 wherein the first microcontroller is arranged in a second area of the circuit;
 wherein the second area fulfills stricter safety requirements than the first area;
 wherein the coupler allows a bidirectional signal transmission from the first area into the second area; and
 wherein the first microcontroller is designed for controlling and adjusting at least one of the multiplexer or the analog-digital converter.

8. The diagnostic circuit of claim 6, wherein the first area fulfills the requirements of an intrinsically safe circuit and the second area is not realized in the form of an intrinsically safe circuit.

9. The diagnostic circuit of claim 6, wherein the first and the second area are separated by an galvanic isolation.

10. The diagnostic circuit of claim 1, wherein at least one element that is selected from the group comprising of first microcontroller, multiplexer, analog-digital converter, potentiometer, first electric resistor and second electric resistor is realized in the form of a discrete, separate component.

11. The diagnostic circuit of claim 1, wherein the analog signal is an analog electric current signal; and wherein the electric current signal is generated by at least one of a level gauge, a pressure gauge and a flowmeter and corresponds at least one of to a measured level, pressure and a flow value.

12. An arrangement, comprising:
 a diagnostic circuit including a multiplexer selecting different signals and a first microcontroller controlling at least the multiplexer,
 wherein a supply voltage is provided for the microcontroller and
 wherein the diagnostic circuit is configured to detect a change in the supply voltage on the basis of a comparison of the supply voltage with a stored supply voltage reference value of the supply voltage by utilizing the multiplexer and the first microcontroller.

13. The arrangement of claim 12, wherein the arrangement is one of a level gauge, a pressure gauge and a flowmeter.

14. A method for monitoring an analog-digital converter circuit during an input of a measured value of at least one of a level gauge, a pressure gauge and a flowmeter, comprising:
 supplying a microcontroller with a supply voltage, the microcontroller being configured control at least the multiplexer, the multiplexer being configured to select different signals;
 measuring the supply voltage;
 comparing the measured supply voltage with a stored supply voltage reference value of the supply voltage; and
 detecting a change in the supply voltage on the basis of the comparison.

* * * * *